US010068936B2

(12) United States Patent
Hsieh et al.

(10) Patent No.: US 10,068,936 B2
(45) Date of Patent: Sep. 4, 2018

(54) PRINTED CIRCUIT BOARD ASSEMBLY FORMING ENHANCED BIOMETRIC MODULE AND MANUFACTURING METHOD THEREOF

(71) Applicant: SunASIC Technologies, Inc., New Taipei (TW)

(72) Inventors: Chung Hao Hsieh, New Taipei (TW); Chi Chou Lin, New Taipei (TW); Zheng Ping He, Taipei (TW)

(73) Assignee: SunASIC Technologies, Inc., New Taipei (TW)

( * ) Notice: Subject to any disclaimer, the term of this patent is extended or adjusted under 35 U.S.C. 154(b) by 202 days.

(21) Appl. No.: 14/941,747

(22) Filed: Nov. 16, 2015

(65) Prior Publication Data

US 2017/0142834 A1    May 18, 2017

(51) Int. Cl.
| | |
|---|---|
| *H01L 27/146* | (2006.01) |
| *H05K 1/18* | (2006.01) |
| *H05K 3/30* | (2006.01) |
| *H01L 31/0203* | (2014.01) |
| *G06K 9/00* | (2006.01) |
| *H01L 23/14* | (2006.01) |
| *H01L 23/13* | (2006.01) |

(52) U.S. Cl.
CPC .... *H01L 27/14609* (2013.01); *G06K 9/00006* (2013.01); *H01L 23/142* (2013.01); *H01L 31/0203* (2013.01); *H05K 1/18* (2013.01); *H05K 3/30* (2013.01); *H01L 23/13* (2013.01)

(58) Field of Classification Search
CPC ...... G06K 9/00006; H01L 2224/24227; H01L 2924/16151; H01L 2924/1615; H01L 27/14634
See application file for complete search history.

(56) References Cited

U.S. PATENT DOCUMENTS

| | | | | |
|---|---|---|---|---|
| 5,862,248 | A * | 1/1999 | Salatino | G06F 3/044 382/124 |
| 6,683,971 | B1 * | 1/2004 | Salatino | G06K 9/00053 382/124 |
| 2005/0069181 | A1 * | 3/2005 | Setlak | G06K 9/00013 382/124 |
| 2005/0110103 | A1 * | 5/2005 | Setlak | G06K 9/0002 257/414 |
| 2014/0303452 | A1 * | 10/2014 | Ghaffari | A61B 1/05 600/301 |
| 2015/0243571 | A1 * | 8/2015 | Tsai | H01L 23/041 257/680 |

* cited by examiner

*Primary Examiner* — Julio J Maldonado
*Assistant Examiner* — Abbigale Boyle
(74) *Attorney, Agent, or Firm* — Che-Yang Chen; Law Offices of Scott Warmuth

(57) ABSTRACT

A Printed Circuit Board Assembly (PCBA) for forming an enhanced biometric module and a method for manufacturing the PCBA are disclosed. The method includes the steps of providing a PCB, a biometric sensing chip and SMDs; mounting the biometric sensing chip on the PCB with each bonding pad being electrically linked to one corresponding first contact pad; mounting the SMDs on second contact pads which are electrically linked thereto, respectively; and forming a protection layer. The present invention takes advantages of compact size of small conductive elements to avoid cracks in the protection layer.

12 Claims, 7 Drawing Sheets

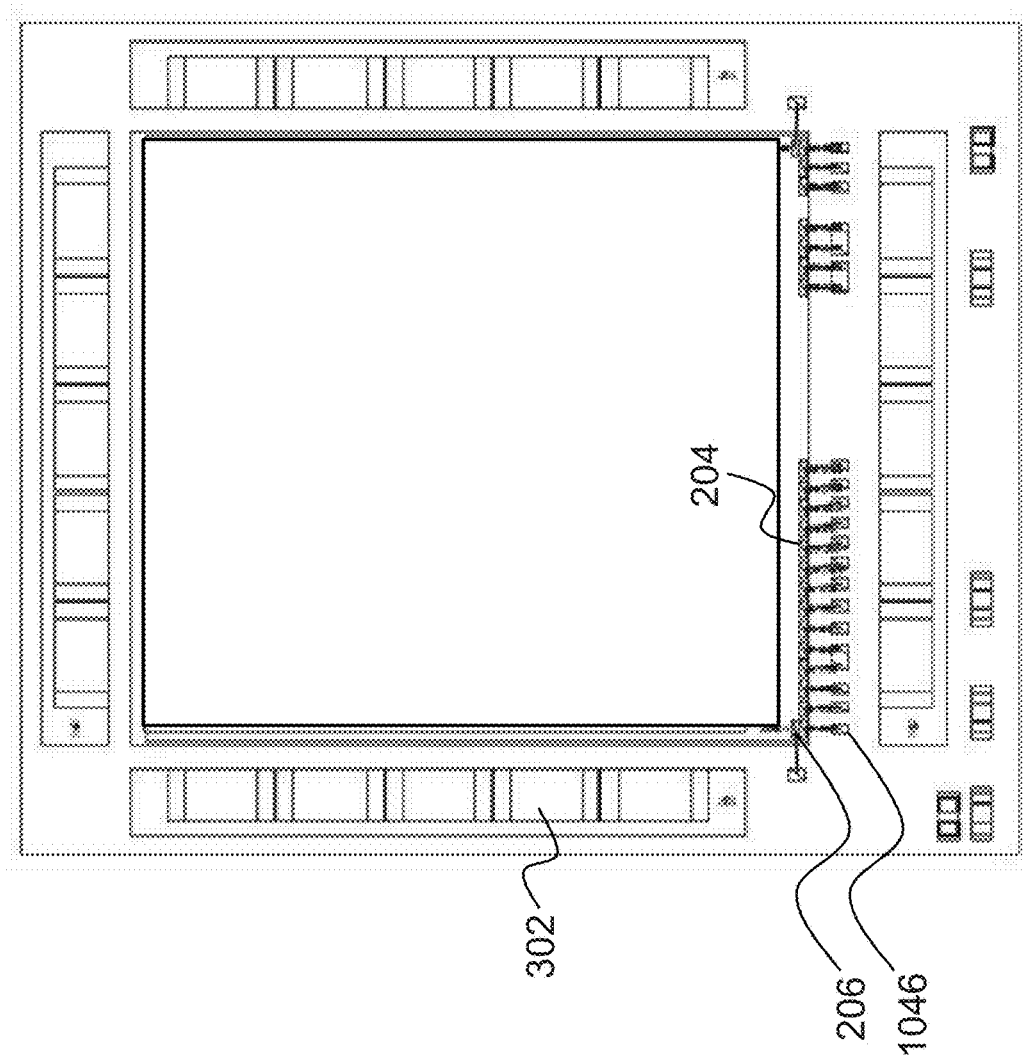

PRINTED CIRCUIT BOARD ASSEMBLY FORMING ENHANCED BIOMETRIC MODULE AND MANUFACTURING METHOD THEREOF

FIELD OF THE INVENTION

The present invention relates to a Printed Circuit Board Assembly (PCBA) and a method for manufacturing the PCBA. More particularly, the present invention relates to a PCBA which forms an enhanced biometric module and a method for manufacturing the PCBA.

BACKGROUND OF THE INVENTION

Many types of biometric features can be used as a form of identification and access control, while others may be used to monitoring physical status of a human body, such as heart bit, oxygen saturation, etc. Among methods of fetching biometric features, measuring impedance, including resistance and capacitance, of some part of human body is a convenient method in some instances. Some biometric module, such as a fingerprint sensing module, is designed to measure difference of capacitance or resistance over a sensing surface to fetch biometric data. An additional excitation signal source close to a sensing unit in the biometric module can be used to improve the performance of the biometric module. For example, in U.S. Pat. No. 8,736,001, a bezel structure coupled to circuitry to serve as a drive electrode for providing the excitation signals to a finger of a user is provided. In fact, like iPhone 6 marketed by Apple Inc, a metal ring is formed around the home key where a fingerprint sensor is embedded. The metal ring plays the same role as the bezel structure in '001. However, such technique may have two problems. First, the exposed bezel structure or the metal ring (called the signaling structure hereinafter) directly contacted with human body may cause malfunction of the fingerprint sensor. More specifically, size of the human body makes itself an antenna like device that can pick up radiation signals which may interfere with the fingerprint sensing function. Second, the signaling structure increases total height of a mobile device equipped with the biometric module and also causes a non-flat top surface of the device. It is not the compact and modern simplicity design that people are looking for.

Therefore, a trend is to absorb the signaling structure in a package level, i.e., Printed Circuit Board (PCB) level. Namely, it is to form the signaling structure as a step of a Printed Circuit Board Assembly (PCBA). Take a fingerprint sensing module for illustration, the PCBA shown in FIG. 1 will solve the problems mentioned above. However, since the fingerprint sensing module is made by different materials (the sensing unit may be an Integrated Circuit, the excitation signal source may be a specific metal and a protective layer would be a thermosetting resin), some unexpected trouble, such as structure deformation, would occur during the manufacturing processes.

Please see FIG. 1. FIG. 1 is a cross-sectional view of a fingerprint sensing module 1 formed by the above method. In order to have a clear view of the architecture of the fingerprint sensing module 1, scale in the vertical direction is larger than that in the horizontal direction. Namely, a real fingerprint sensing module is thinner than the fingerprint sensing module 1 in FIG. 1. The fingerprint sensing module 1 is basically composed of a PCB 2, a fingerprint sensing chip 3, two electrodes 4 and a protective layer 5. The PCB 2 functions as a substrate to carry all necessary electronic components of the fingerprint sensing module 1, including the fingerprint sensing chip 3 and the electrodes 4. The electrodes 4 are mounted on the PCB 2 and are very close to the fingerprint sensing chip 3. In fact, the electrodes 4 may be two separate metal bars, or in the form of a complete metal ring which is cut in two portions in the cross-section. The protective layer 5 may be made of a molding compound, spreading over the fingerprint sensing chip 3, the electrodes 4, other electronic components and partial surface of the PCB 2. The protective layer 5 is used to protect the elements underneath. The whole fingerprint sensing module 1 may be partially assembled in a secure device or a smart phone.

It is clear that the electrodes 4 and the protective layer 5 are made of different materials. The electrodes 4 may be made of a specific metal or alloy, e.g. aluminum. The protective layer 5 can mainly contain epoxy resin. When the materials of the protective layer 5 are applied and before the protective layer 5 is formed, a curing process must be done to heat up the fingerprint sensing module 1 to a temperature the epoxy resin can be fixed. Thermal expansion coefficient of the electrode 4 is much larger than that of the epoxy resin. When being heated, the electrode 4 expands to all directions as the solid arrows shown while the epoxy resin is losing liquidity and becomes fixed. Therefore, there are cracks in the protective layer 5 growing from the electrodes 4 while the fingerprint sensing module 1 is cooled back to room temperature. Besides, there may also be a reflow step to mount the fingerprint sensing module 1 to other electrical device. Those cracks may result in mechanical weakness and/or structure deformation of the module.

Therefore, a PCBA which forms an enhanced biometric module and a method for manufacturing the PCBA is desired to settle the problem mentioned above.

SUMMARY OF THE INVENTION

This paragraph extracts and compiles some features of the present invention; other features will be disclosed in the follow-up paragraphs. It is intended to cover various modifications and similar arrangements included within the spirit and scope of the appended claims.

In order to settle the problem mentioned above, an aspect of the present invention is to provide a PCBA forming an enhanced biometric module. The PCBA includes: a Printed Circuit Board (PCB), including: an insulation layer; and an electrically conductive layer, forming a working circuit, an excitation circuit, a plurality of first contact pads and a plurality of second contact pads on a portion of a top surface of the insulation layer, wherein the second contact pads are linked to the excitation circuit; a biometric sensing chip, mounted on the PCB, including: a sensing area; a number of bonding pads, each bonding pad being electrically linked to one corresponding first contact pad; and an excitation signal source, electrically linked to the excitation circuit via one bonding pad, for providing an excitation signal; a number of small conductive elements, each small conductive element mounted on the second contact pad(s), for providing the excitation signal to an approached object; and a protection layer, formed over the PCB, the biometric sensing chip and the small conductive elements, having a flat top surface.

Preferably, the excitation circuit further has a signal enhancing unit for enhancing the excitation signal. The biometric sensing chip may be a fingerprint sensing chip. The protection layer may be made of molding compound materials. The molding compound material is epoxy resin. A level of a top surface of each small conductive element is equal to or higher than that of the biometric sensing chip after the PCBA is formed. The excitation circuit is arranged around or adjacent to the biometric sensing chip. The small conductive element may be a Surface Mount Devices (SMDs), a conductive chip, or a metal cuboid. The small conductive element may have a size of 0201, 0402 or 0603 of a SMD. The PCBA further includes a hard coating layer made of an oleophobic and hydrophobic material over the protection layer.

Another aspect of the present invention is to provide a method for manufacturing the PCBA mentioned above. The method comprises the steps of: providing the PCB, the biometric sensing chip and the small conductive elements; mounting the biometric sensing chip on the PCB with each bonding pad being electrically linked to one corresponding first contact pad; mounting the small conductive elements on the second contact pads which are electrically linked thereto, respectively; and forming the protection layer. If necessary, a step can be included: forming a hard coating layer made of an oleophobic and hydrophobic material over the protection layer.

The present invention takes advantages of compact size of small conductive elements, such as SMDs, to avoid cracks in the protection layer. Meanwhile, the present invention has below advantages to use small conductive elements: 1) the manufacturing process utilizes standard SMT process which is a mature technique; 2) cost of the small conductive elements is much lower than that of a metal ring, metal frame or metal strips; and 3) additional tooling cost for the metal ring, metal frame or metal strip can be exempt.

BRIEF DESCRIPTION OF THE DRAWINGS

FIG. 7 is a top view of another PCBA which forms an enhanced biometric module according to the present invention.

DETAILED DESCRIPTION OF THE PREFERRED EMBODIMENTS

The present invention will now be described more specifically with reference to the following embodiments.

Figure 1:
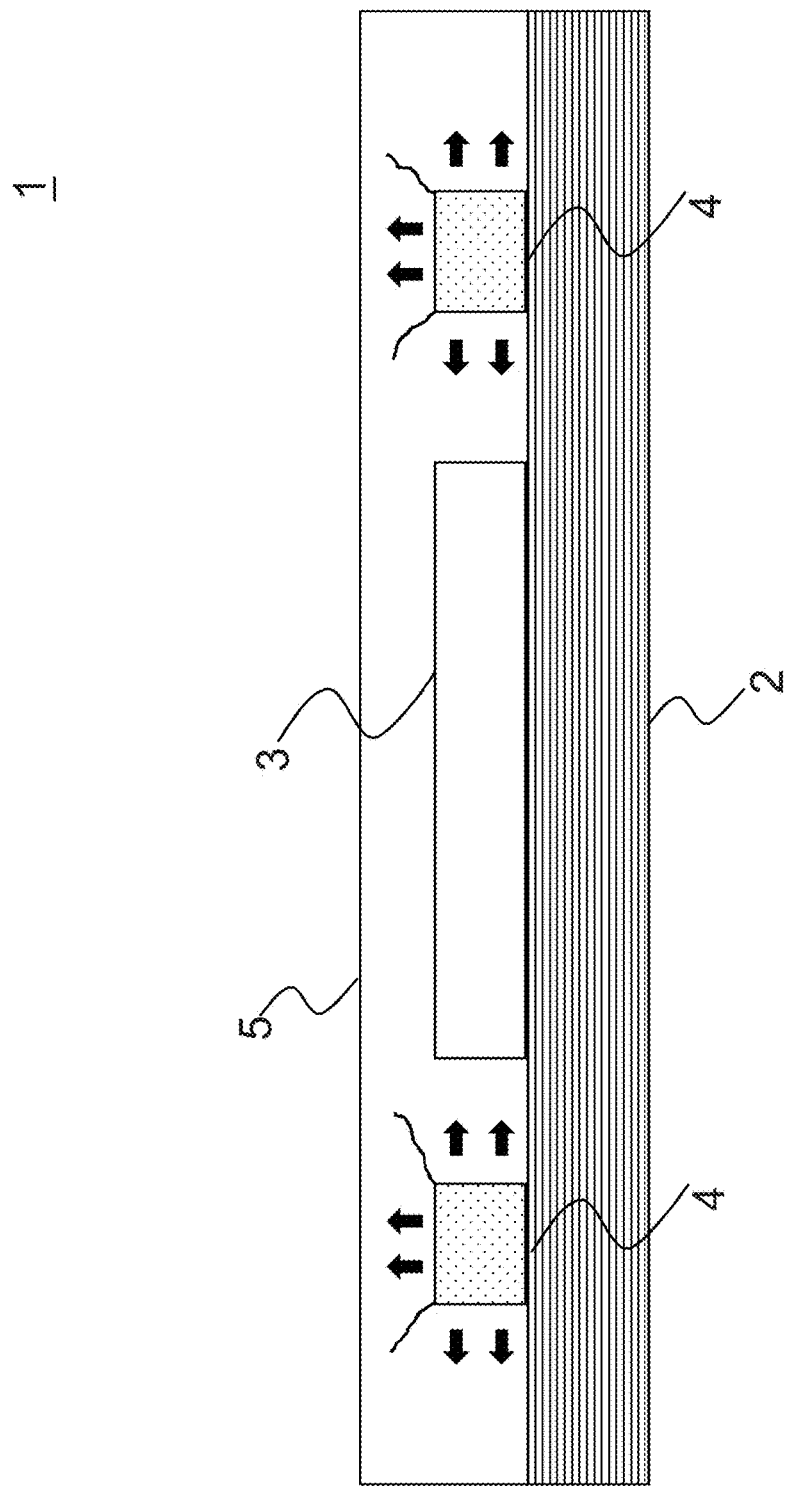
FIG. 1 is a cross-sectional view of a conventional fingerprint sensing module.
Figure 2:
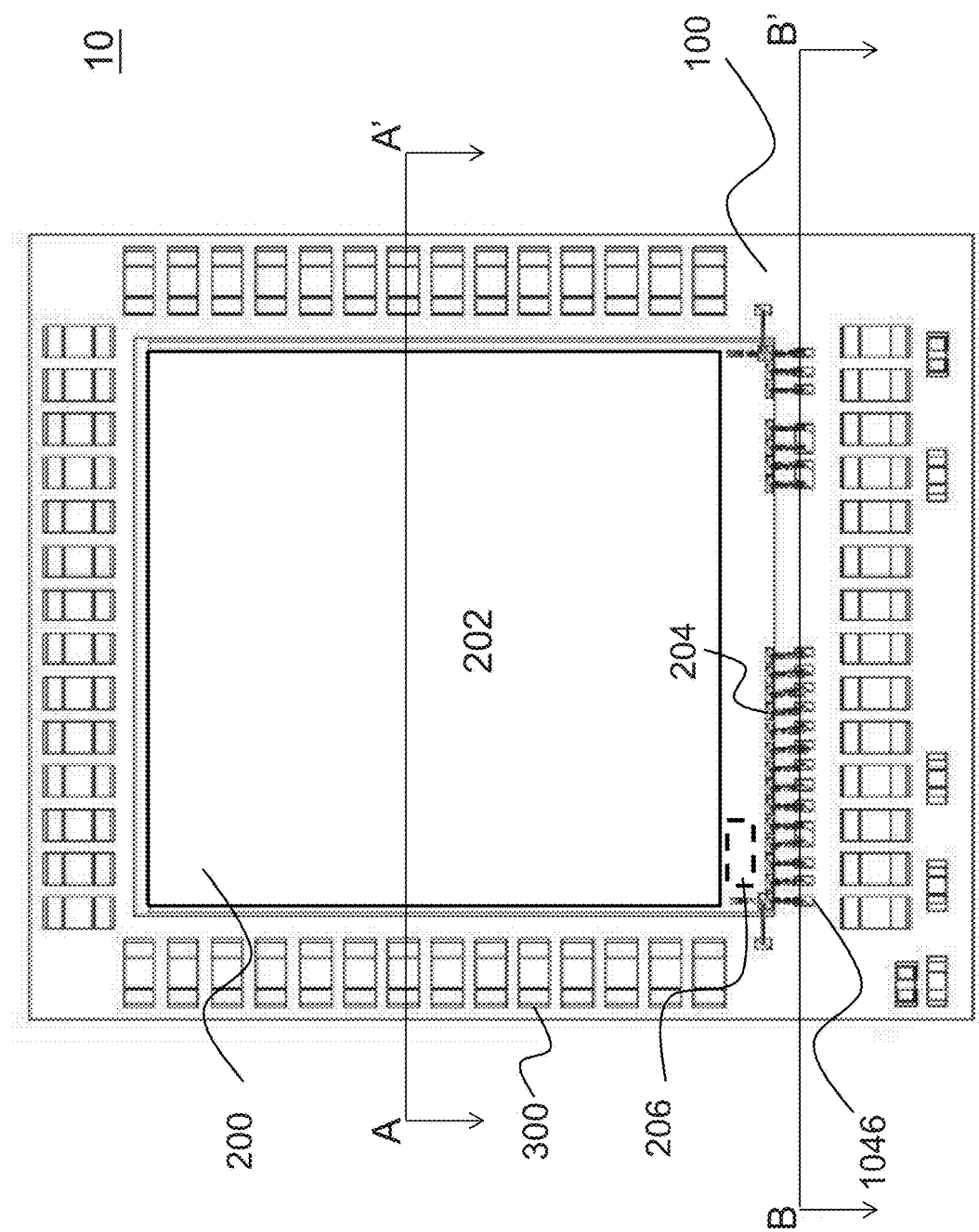
FIG. 2 is a top view of a PCBA which forms an enhanced biometric module according to the present invention.
Figure 3:
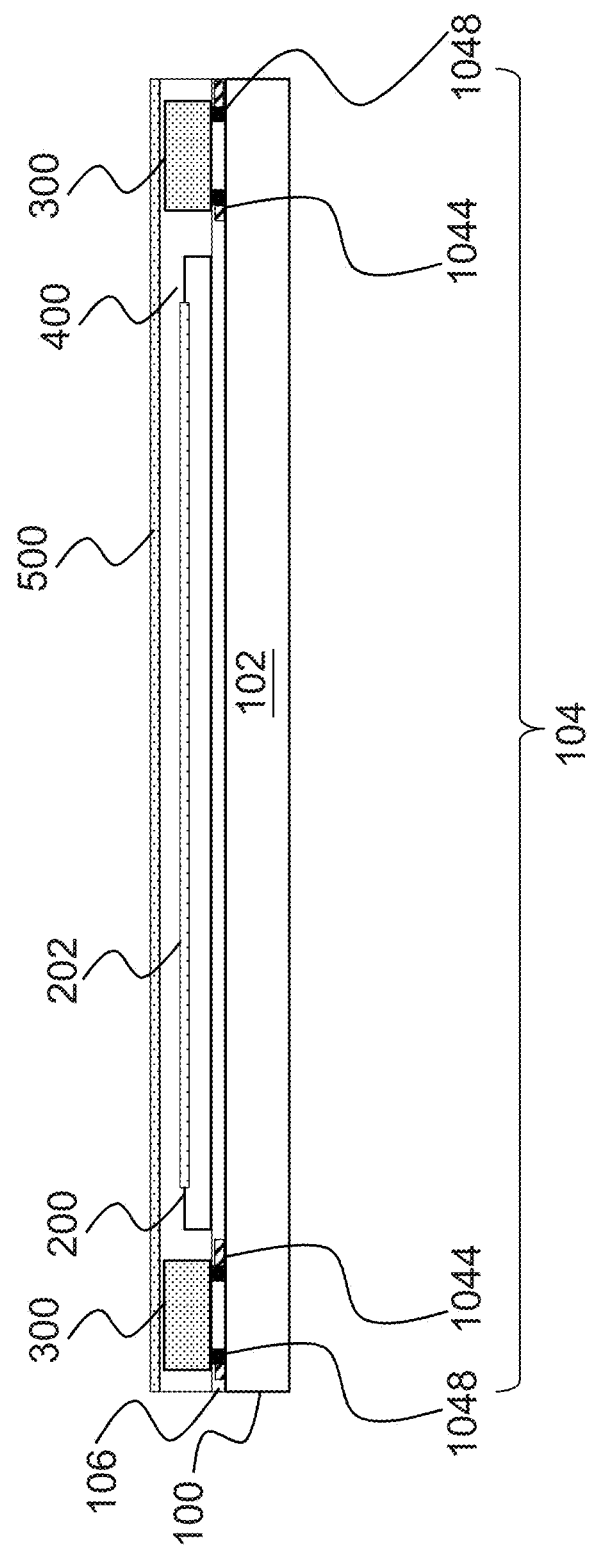
FIG. 3 is a cross-sectional view along line AA' in FIG. 2.
Figure 4:
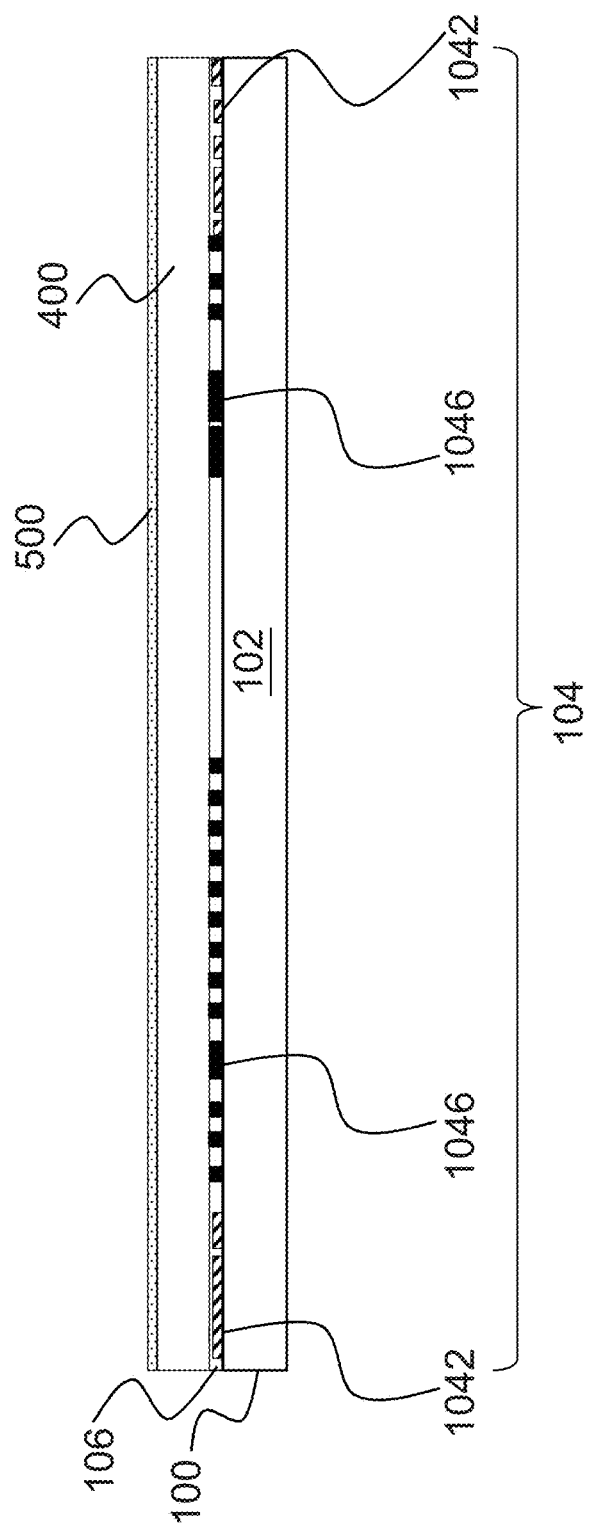
FIG. 4 is a cross-sectional view along line BB' in FIG. 2.
Figure 5:
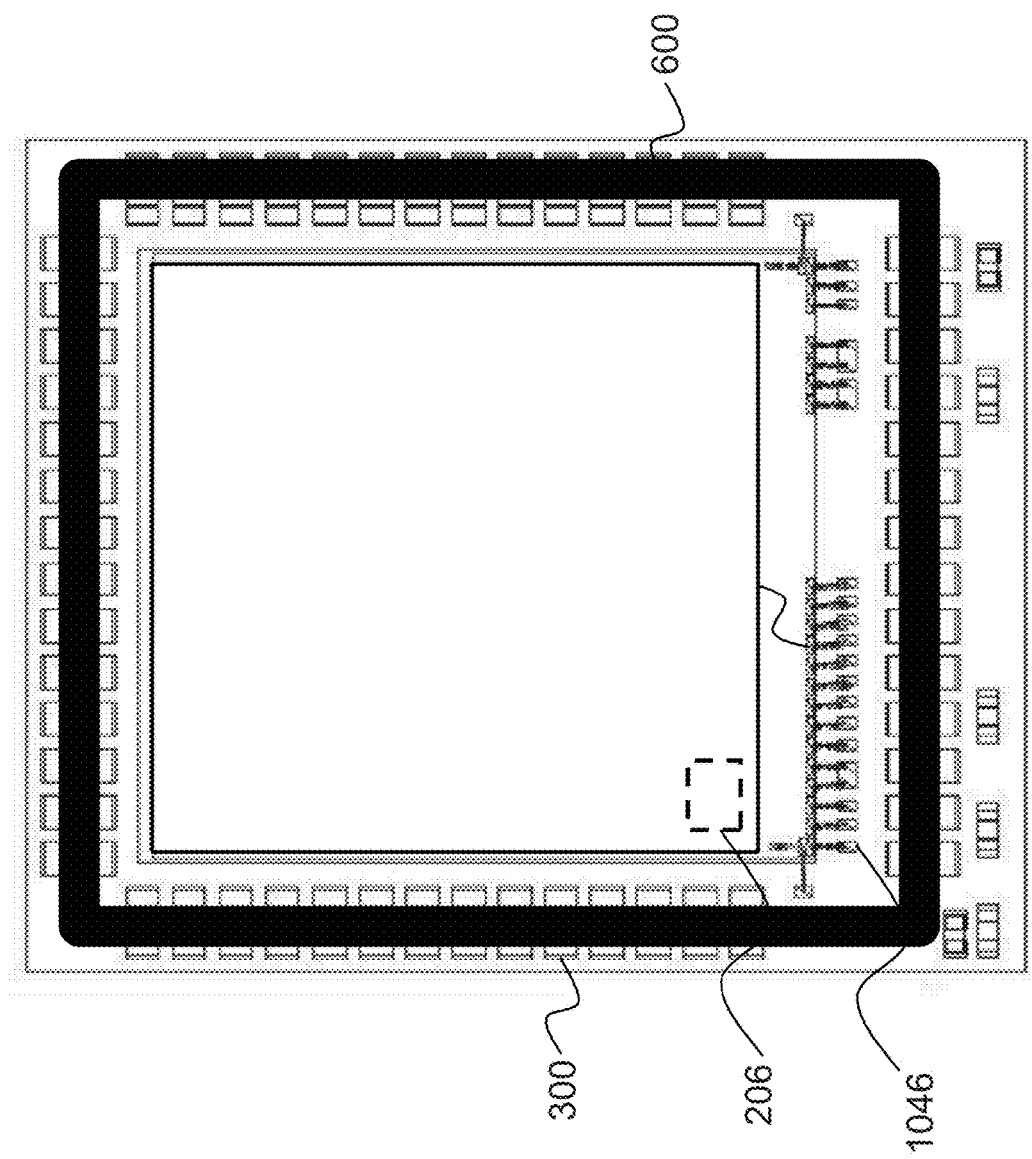
FIG. 5 is a top view of a PCBA with SMDs replaced.

Please refer to FIG. 2 to FIG. 5. A first embodiment of a PCBA 10 which forms an enhanced biometric module according to the present invention is disclosed. Please see FIG. 2 to FIG. 4 at the same time. FIG. 2 is a top view of the PCBA 10. FIG. 3 is a cross-sectional view of the PCBA 10 along line AA' and FIG. 4 is a cross-sectional view of the PCBA 10 along line BB' in FIG. 2. The PCBA 10 is composed of a Printed Circuit Board (PCB) 100, a biometric sensing chip 200, a number of small conductive elements 300, a protection layer 400 and a hard coating layer 500. Functions and composition of all elements are described in details below.

The PCB 100 basically should include an insulation layer 102 and an electrically conductive layer 104. A number of openings (not shown) may be formed in a solder mask 106 to expose contact pads. Solder mask 106 is commonly applied on a PCB for protection against oxidation and to prevent solder bridges from forming between closely spaced pads. Of course, according to the spirit of the present invention, there can be other insulation layers and electrically conductive layers based on extra solution the PCBA 100 would like to provide. The insulation layer 102 and electrically conductive layer 104 introduced here carry out the key function for running the biometric sensing chip 200 and connecting the biometric sensing chip 200 with other components. The insulation layer 102 should be rigid enough. It is the main portion of the PCBA 100 to support other elements thereon and resists a normal force exerted on the biometric sensing chip 200.

The electrically conductive layer 104 forms a working circuit 1042, an excitation circuit 1044, a number of first contact pads 1046 and a number of second contact pads 1048 on a portion of a top surface of the insulation layer 102. Meanwhile, in order to have a clear view of the architecture of the PCBA 10, scale in the vertical direction is larger than that in the horizontal direction. Namely, a real PCBA is thinner than the one in FIG. 3. FIG. 3 shows arrangement of the excitation circuit 1044 and the contact pads 1048. In fact, the working circuit 1042, the excitation circuit 1044, the first contact pads 1046 and the second contact pads 1048 are manufactured by the same process. The first contact pads 1046 and the second contact pads 1048 are made by forming openings in the solder mask 106 wherever wire bonding is applied and components are soldered. The second contact pads 1048 and the excitation circuit 1044 are made for different functionality. However, the second contact pads 1048 should be made to link to somewhere of the excitation circuit 1044 though they are seemed to be separated from the excitation circuit 1044 at this cross section. Different display effects (cross section of the excitation circuit 1044 is filled with slashes while that of the second contact pads 1048 is solid filled) are applied to have a better visibility for the two. The second contact pads 1048 are drawn a little higher than the excitation circuit 1044. In fact, they should be equally high in the thickness direction. The extra height is to illustrate the second contact pads 1048 are exposed through the openings and get soldered with components above. The excitation circuit 1044 won't touch directly with the solders since there is the solder mask 106 in between. The second contact pads 1048 and the excitation circuit 1044 are mainly formed around where the biometric sensing chip 200 is designed to be located.

Arrangement of the working circuit 1042 and the first contact pads 1046 are shown in FIG. 4. Preferably, the working circuit 1042 and the first contact pads 1046 should be located away from the biometric sensing chip 200 but close to I/O ports of the biometric sensing chip 200. Similarly, different display effects (cross section of the working circuit 1042 is filled with slashes while that of the first contact pads 1046 is solid filled) are applied to have a better visibility for the two. The first contact pads 1046 are drawn a little higher than the working circuit 1042 just to illustrate the first contact pads 1046 are exposed through the openings and electrically linked with I/O pads of the biometric sensing chip 200. Here, the linkage method is wire bonding, but other reliable method forming electrical linkage may also be applied.

Functions of the working circuit 1042 are mainly for linking the PCBA 10 with other device which the PCBA 10 is mounted on. Of course, any assistance for the PCBA 10 to normally operate can be designed in the working circuit 1042, such as Electrostatic Discharge (ESD) protection. The excitation circuit 1044 is basically a line to provide an excitation signal from the biometric sensing chip 200 to human body to enhance the performance of the biometric sensing chip 200. The effect of the excitation signal is directly affected by the impedance between the excitation circuit 1044 and an object, e.g. a finger. Reducing the distance between the excitation circuit 1044 and the object will reduce the impedance therebetween, further improving the effect of the excitation signal. The biometric sensing chip 200 is relatively thicker than the electrically conductive layer 104. Comparing with the distance between the biometric sensing chip and the object, a larger distance between the excitation circuit 1044 and the object will significantly reduce the effect of the excitation signal. Therefore, there must be some other conductive structure over the excitation circuit 1044 to reduce the impedance between the excitation circuit 1044 and the object, and to provide the excitation signal at a position equal to or higher than the top surface of the biometric sensing chip 200. In fact, the physical shape of the excitation circuit 1044 may vary, e.g., signal line, circular ring, arc, rectangular ring, or multiple lines. The first contact pads 1046 are used for linking I/O ports of the biometric sensing chip 200. The second contact pads 1048 are formed in the excitation circuit 1044. They are used to connect to the small conductive elements 300.

The biometric sensing chip 200 is mounted on the PCB 100. It includes three key parts: a sensing area 202, a number of bonding pads 204 and an excitation signal source 206. The biometric sensing chip 200 can be any chip which is used to detect biometric characteristics of human body while external voltage is applied. The sensing area 202 is used for this job. In this embodiment, the biometric sensing chip 200 is a fingerprint sensing chip. Each of the bonding pads 204 is electrically linked to one corresponding first contact pad 1046. The bonding pads 204 are I/O ports of the biometric sensing chip 200. The excitation signal source 206 is electrically linked to the excitation circuit 1044 via one bonding pad 204 for providing the excitation signal. The excitation signal is a capacitively coupled excitation signal sent out from the biometric sensing chip 200 to one detected object through the small conductive elements 300. In addition, the capacitively coupled excitation signal may reduce the interference of signals at low-frequency (around 60 Hz), further reducing the noise of the output signal of the biometric sensing chip 200, and preventing the biometric sensing chip 200 from malfunction. Moreover, the excitation signal may be a series of step voltage changes which do not have a regular period. Ideally, the biometric sensing chip 200 should provide enough voltage to generate the excitation signal. However, power of the excitation signal may attenuate when more components existed between the excitation signal source 206 and the detected object. Preferably, the excitation circuit 1044 can further have an signal enhancing unit (not shown), such as an amplifier, for enhancing the excitation signal to a level that the voltage of the excitation signal can lead to a desired operation of the biometric sensing chip 200.

The small conductive element 300 is an innovative application for one biometric sensing chip according to the present invention. The small conductive element 30 has a size close to a Surface Mount Device (SMD), and can be easily mounted onto the PCB using Surface-mount technology (SMT). Preferably, the small conductive element 300 is a SMD (surface mount resistor is better). If available, a conductive chip or a metal cuboid can be used, too. Each small conductive element 30 is mounted on the second contact pad(s) 1048. It can transmit the excitation signal to an approached object. The small conductive element 300 must be made of electrically conductive material. The arrangement of the small conductive elements 300 is used to replace a conventional signal releasing structure of a metal ring, a metal frame or metal strips. As the excitation circuit 1044 is arranged around or adjacent to the biometric sensing chip 200, it should be mounted with a metal frame above according to a conventional process. Instead, the small conductive elements 300 are connected to the excitation circuit 1044 via the second contact pads 1048 to replace the metal frame according to the present invention. Please see a comparison between the conventional structure and the one provided by the present invention in FIG. 5. A metal frame 600 marked in black is positioned above the excitation circuit 1044. Comparing with the metal frame 600, the small conductive elements 300 have the similar total area for releasing the excitation signal. However, the small conductive elements 300 are discrete. As mentioned above, if the metal frame 600 is used, the whole package may crack because of thermal expansion and/or contraction. To be more precisely, this is because the amount of volume change is too large to cause the protection layer 400 huge internal stresses. When the metal frame 600 is replaced by the small conductive elements 300, strain of the small conductive elements 300 is relatively small. The protection layer 400 won't be stressed to generate cracks. Meanwhile, functions of the metal frame 600 can be transferred to the small conductive elements 300. In addition, there are several advantages to use SMDs: 1) the manufacturing process utilizes standard SMT process which is a mature technique; 2) cost of the SMDs is much less than that of a metal ring, metal frame or metal strips; and 3) additional tooling cost for the metal ring, metal frame or metal strip can be exempt.

It should be noticed that the small conductive elements 300 have a limitation. Please see FIG. 3 again. A level of a top surface of each small conductive element 300 should be equal to or higher than that of the biometric sensing chip 200 after the PCBA 10 is formed. At least, the level of the top surface of the small conductive element 300 can not be lower than that of the biometric sensing chip 200. If the level of the top surface of the small conductive element 300 is lower than that of the biometric sensing chip 200, effect of the small conductive elements 300 will be reduced.

The protection layer 400 is formed over the PCB 100, the biometric sensing chip 200 and the small conductive elements 300. It has a flat top surface. The protection layer 400 is usually made of a molding compound material. Preferably, the molding compound material is epoxy resin. It provides a basic protection for the PCBA 10. An additional hard coating layer 500 may be needed for improving the surface characteristic of the package, such as impact resistance and mechanical abrasion resistance. Since the top surface of the PCBA 10 often encounters environmental pollutants, e.g. water and oil stain, which may reduce the performance of the biometric sensing chip 200, the hard coating layer 500 can be made of an oleophobic and hydrophobic material over the protection layer 400.

Another aspect of the present invention is to provide a method to manufacture the PCBA 10 mentioned above. Please refer to FIG. 6. The method has processes as below. First, provide the PCB 100, the biometric sensing chip 200 and the small conductive elements 300 (S01). Then, mount the biometric sensing chip 200 on the PCB 100 with each bonding pad 204 being electrically linked to one corresponding first contact pad 1046 (S02). Next, mount the small conductive elements 300 on the second contact pads 1048 which are electrically linked to small conductive elements 300, respectively (S03). At this stage, form the protection layer 400 (S04). Finally, form the hard coating layer 500 made of an oleophobic and hydrophobic material over the protection layer 400 (S05). In fact, in consideration of cost, the hard coating layer 500 may not be necessary. The manufacturing processes stop at step S04. In practice, order of step S02 and S03 can be exchanged. Other components of the PCBA 10 can be mounted at S02 or S03. It is not limited by the present invention.

Figure 6:
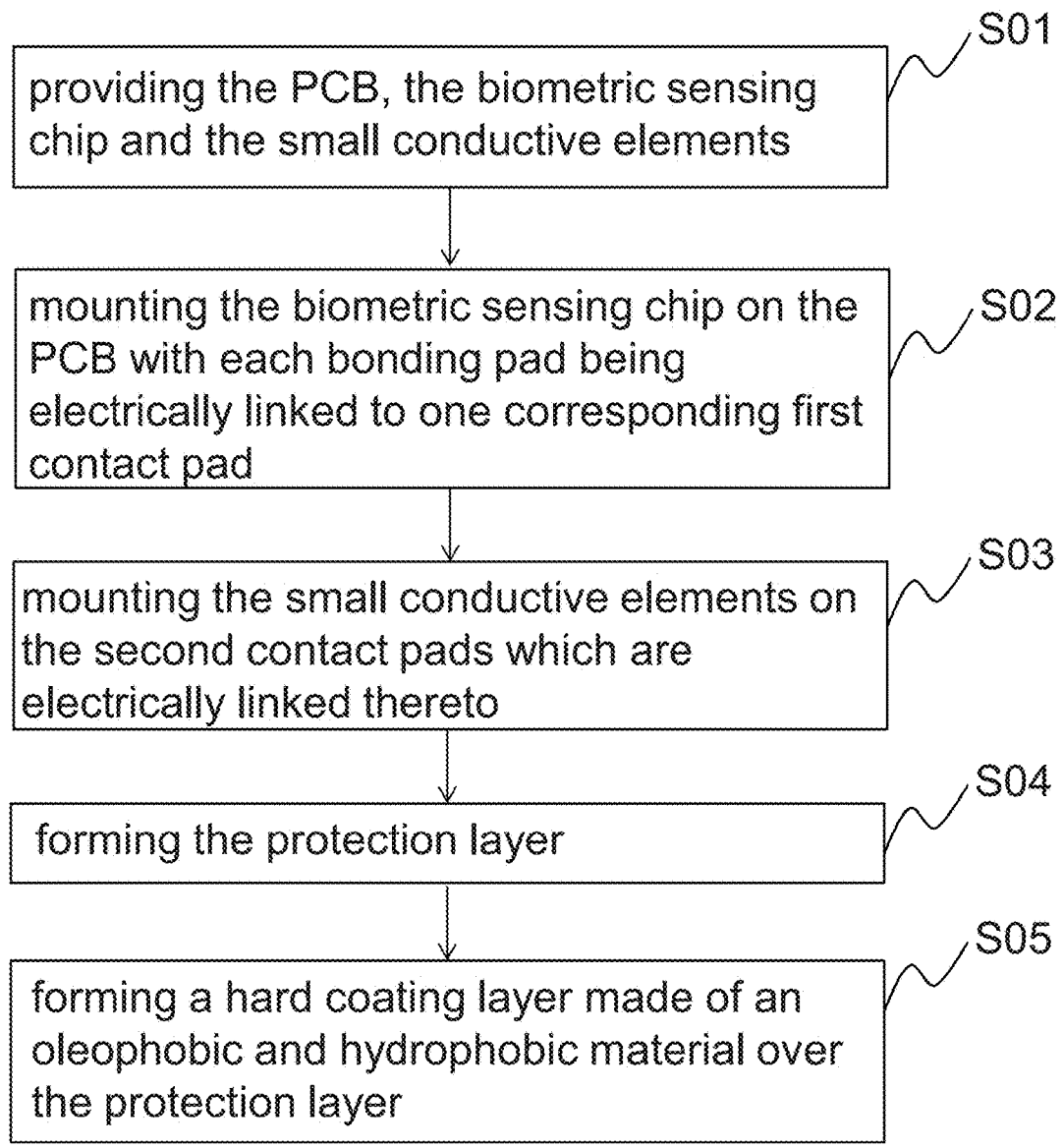
FIG. 6 is a flow chart of a method for forming the PCBA.

In the first embodiment, it is obvious that the small conductive element 300 has a size of 0201 of SMD. It means the size of the small conductive element 300 from a top view is 0.6 mm×0.3 mm. In fact, other large sized small conductive element can be applied according to the present invention. For example, SMD of 0402 (1.0 mm×0.5 mm) or 0603 (1.6 mm×0.8 mm). Please see FIG. 7. In FIG. 7, the small conductive element 300 of size of 0201 SMD is replaced by a SMD 302 of 0603. Since the size of each SMD 302 is larger, arrangement of the SMDs 302 should be changed. For example, the SMDs 302 in FIG. 6 is rotated 90 degrees from the small conductive elements 300 in FIG. 2. It should be noticed that for arrangement of large small conductive elements, enough space between adjacent small conductive elements should be available in case of cracks due to large strain.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A Printed Circuit Board Assembly (PCBA) forming an enhanced biometric module, comprising:
    a Printed Circuit Board (PCB), comprising:
        an insulation layer; and
        an electrically conductive layer, forming a working circuit, an excitation circuit, a plurality of first contact pads and a plurality of second contact pads on a portion of a top surface of the insulation layer, wherein the second contact pads are linked to the excitation circuit;
    a biometric sensing chip, mounted on the PCB, comprising:
        a sensing area;
        a plurality of bonding pads, each bonding pad being electrically linked to one corresponding first contact pad; and
        an excitation signal source, electrically linked to the excitation circuit via one of the plurality of bonding pads, for providing an excitation signal;
    a plurality of small conductive elements, each of the plurality of small conductive elements are mounted on the second contact pad(s), wherein each of the plurality of small conductive elements are spaced apart from each other and the excitation signal provided by the excitation signal source is passed to an approached object via each of the plurality of small conductive elements; and
    a protection layer, formed over the PCB, the biometric sensing chip and the small conductive elements, having a flat top surface.

2. The PCBA according to claim 1, wherein the excitation circuit further has a signal enhancing unit for enhancing the excitation signal.

3. The PCBA according to claim 1, wherein the biometric sensing chip is a fingerprint sensing chip.

4. The PCBA according to claim 1, wherein the protection layer is made of molding compound materials.

5. The PCBA according to claim 4, wherein the molding compound material is epoxy resin.

6. The PCBA according to claim 1, wherein a level of a top surface of each small conductive element is equal to or higher than that of the biometric sensing chip after the PCBA is formed.

7. The PCBA according to claim 1, wherein the excitation circuit is arranged around or adjacent to the biometric sensing chip.

8. The PCBA according to claim 1, wherein the small conductive element is a Surface Mount Device (SMD), a conductive chip, or a metal cuboid.

9. The PCBA according to claim 1, wherein the small conductive element has a size of 0201, 0402 or 0603 of a SMD, measuring 0.6 mm×0.3 mm, 1.0 mm×0.5 mm, and 1.6 mm×0.8 mm in top-down view, respectively.

10. The PCBA according to claim 1, further comprising a hard coating layer made of an oleophobic and hydrophobic material over the protection layer.

11. A method for manufacturing the PCBA in claim 1, comprising the steps of:
    providing the PCB, the biometric sensing chip and the small conductive elements;
    mounting the biometric sensing chip on the PCB with each bonding pad being electrically linked to one corresponding first contact pad;
    mounting the small conductive elements on the second contact pads which are electrically linked thereto, respectively; and
    forming the protection layer.

12. A method for manufacturing the PCBA in claim 10, comprising the steps of:
    providing the PCB, the biometric sensing chip and the small conductive elements;
    mounting the biometric sensing chip on the PCB with each bonding pad being electrically linked to one corresponding first contact pad;
    mounting the small conductive elements on the second contact pads which are electrically linked thereto, respectively;
    forming the protection layer; and
    forming a hard coating layer made of an oleophobic and hydrophobic material over the protection layer.

* * * * *